United States Patent
Mornet et al.

(10) Patent No.: US 9,797,586 B2
(45) Date of Patent: Oct. 24, 2017

(54) LIGHTING MODULE WITH DETACHABLE CONTROL DEVICE

(71) Applicant: VALEO VISION, Bobigny (FR)

(72) Inventors: Eric Mornet, Nogent sur Marne (FR); Pascal Garin, Saint Denis le Ferment (FR)

(73) Assignee: Valeo Vision, Bobigny (FR)

( * ) Notice: Subject to any disclaimer, the term of this patent is extended or adjusted under 35 U.S.C. 154(b) by 83 days.

(21) Appl. No.: 14/422,547

(22) PCT Filed: Aug. 5, 2013

(86) PCT No.: PCT/EP2013/066406
§ 371 (c)(1),
(2) Date: Feb. 19, 2015

(87) PCT Pub. No.: WO2014/032912
PCT Pub. Date: Mar. 6, 2014

(65) Prior Publication Data
US 2015/0211721 A1  Jul. 30, 2015

(30) Foreign Application Priority Data

Aug. 27, 2012  (FR) ...................... 12 58008

(51) Int. Cl.
| | |
|---|---|
| *F21V 23/06* | (2006.01) |
| *F21V 23/00* | (2015.01) |
| *B60Q 1/00* | (2006.01) |
| *F21S 8/10* | (2006.01) |
| *H05K 1/02* | (2006.01) |

(Continued)

(52) U.S. Cl.
CPC .......... *F21V 23/008* (2013.01); *B60Q 1/0094* (2013.01); *F21S 48/115* (2013.01); *F21S 48/1109* (2013.01); *F21S 48/155* (2013.01); *F21S 48/321* (2013.01); *F21S 48/328* (2013.01); *F21V 23/001* (2013.01); *H05K 1/0209* (2013.01); *F21W 2101/00* (2013.01);
(Continued)

(58) Field of Classification Search
CPC .... F21V 23/003; F21V 23/004; F21V 23/006; F21V 23/009; F21V 29/004; F21V 29/2212
See application file for complete search history.

(56) References Cited

U.S. PATENT DOCUMENTS 7,701,144 B2   4/2010  Tsukamoto et al.
7,758,223 B2 *  7/2010  Osawa ................... F21K 9/135
                                                      362/240

(Continued)

FOREIGN PATENT DOCUMENTS

DE   202004003793 U1   5/2004
EP       2298599 A1   3/2011
(Continued)

*Primary Examiner* — Ismael Negron
(74) *Attorney, Agent, or Firm* — Jacox, Meckstroth & Jenkins

(57) ABSTRACT

A lighting module includes at least one light source arranged on a first printed circuit board, a support secured to the first printed circuit board, and a light source controlling device connected to the first printed circuit board by a flexible electrical link, the controlling device having integrated retaining means for detachably holding the controlling device on the support.

17 Claims, 4 Drawing Sheets

(51) Int. Cl.
*H05K 3/00* (2006.01)
*F21W 101/00* (2006.01)
*F21Y 115/10* (2016.01)

(52) U.S. Cl.
CPC ......... *F21Y 2115/10* (2016.08); *H05K 3/0061* (2013.01); *H05K 2201/10106* (2013.01)

(56) References Cited

U.S. PATENT DOCUMENTS

| | | | |
|---|---|---|---|
| 8,038,329 B2 * | 10/2011 | Takahasi | F21K 9/1355 362/264 |
| 8,115,369 B2 * | 2/2012 | Kang | F21K 9/13 257/706 |
| 8,222,820 B2 * | 7/2012 | Wang | F21V 17/14 313/46 |
| 8,408,769 B2 | 4/2013 | Nicolai et al. | |
| 8,911,125 B2 | 12/2014 | Suzuki et al. | |
| 2007/0247840 A1 * | 10/2007 | Ham | F21S 9/022 362/227 |
| 2008/0129204 A1 | 6/2008 | Tsukamoto et al. | |
| 2010/0264799 A1 * | 10/2010 | Liu | F21V 29/006 313/46 |
| 2011/0103086 A1 | 5/2011 | Nicolai et al. | |
| 2012/0218748 A1 * | 8/2012 | Conrad | F21V 19/0055 362/230 |
| 2012/0250305 A1 * | 10/2012 | Shimizu | F21K 9/1355 362/231 |
| 2012/0268954 A1 * | 10/2012 | Yamamoto | F21K 9/1355 362/382 |
| 2013/0201706 A1 | 8/2013 | Suzuki et al. | |
| 2013/0201707 A1 | 8/2013 | Suzuki et al. | |
| 2014/0354146 A1 * | 12/2014 | Ishiwata | F21K 9/1355 313/512 |
| 2015/0036387 A1 * | 2/2015 | Myers | F21V 23/06 362/646 |
| 2015/0098230 A1 * | 4/2015 | Tamura | F21K 9/1355 362/382 |
| 2015/0103535 A1 * | 4/2015 | Hu | F21V 31/00 362/363 |

FOREIGN PATENT DOCUMENTS

| | | |
|---|---|---|
| WO | 2012042761 A1 | 4/2012 |
| WO | 2012042762 A1 | 4/2012 |

* cited by examiner

LIGHTING MODULE WITH DETACHABLE CONTROL DEVICE

CROSS-REFERENCE TO RELATED APPLICATIONS

This application is the U.S. National Phase application of PCT Application No. PCT/EP2013/066406 filed Aug. 5, 2013, which claims priority to the French application 1258008 filed on Aug. 27, 2012, which applications are incorporated herein by reference and made a part hereof.

BACKGROUND OF THE INVENTION

1. Background of the Invention

The technical sector of the present invention is that of lighting modules capable of generating a light beam. Such a lighting module has a particular application in a lighting and/or signaling device for a vehicle, in particular an automobile.

2. Description of the Related Art

Automobiles are conventionally equipped with a lighting and/or signaling device, referred to as a lamp unit. These use a light source which, until recently, has been produced by means of an incandescent lamp.

A new light source technology is replacing these incandescent lamps: that of light-emitting diodes. These are capable of providing a sufficient lighting performance for signaling and lighting functions, and have the advantage of being small. When used as a light source, these light-emitting diodes also have the advantage of reducing the electricity consumption compared with the same optical function performed by an incandescent lamp. The reasons why automobile manufacturers are eager for this new technology can therefore be understood from this.

These light-emitting diodes release heat, and it is therefore necessary to ensure dissipation of this heat in order to ensure correct operation and the long life of this type of light source. In order to do so, it is known to place these light-emitting diodes close to a heat sink, the combined assembly being installed inside the lamp unit.

Furthermore, these light-emitting diodes are driven electrically by a control device installed in proximity to the assembly mentioned above. According to a first solution known from the prior art, the control device and the light-emitting diodes are placed together on the same printed circuit board, the board then being coupled to the heat sink.

This solution has certain drawbacks. Specifically, combining the control device and the light-emitting diodes on the same printed circuit board requires a large area, because it is necessary to ensure cooling both of the light sources and of the components of the control device. The heat sink is then large, and this size causes difficulties of integration inside the volume of the lamp unit, this volume being particularly restricted.

According to another solution known from the prior art, it has been proposed to install the control device separately from the light sources. Such a solution requires the use of a cable, which the operator in charge of assembling the lamp unit connects on one side to the light sources and on the other side to the control device. This connection is then ensured by means of electrical connectors, of which a male part is secured to the cable while a female part is fixed level with the light sources and the control device.

This solution also has drawbacks. Specifically, because of the weight of each of the components electrically connected by the cable, it requires an electrical connection carried out manually once the light sources and the control device have been secured to the lamp unit. Such an operation is a source of faults, such as a loss of electrical connection due to vibrations or impact, which leads to late rejection of the lamp unit, for example during assembly on the vehicle or when the vehicle is being driven. Furthermore, it is necessary to manage three pieces on the assembly line of the lamp unit, that is to say the lighting module, the cable and the control device. This leads to logistical complications. Lastly, this solution involves the use of plug-in electrical connectors, which represent a nonnegligible cost in the lighting function.

SUMMARY OF THE INVENTION

One object of the present invention is therefore to resolve the drawbacks described above, principally by installing permanent cabling between the control device and the light sources, while organizing temporary and reversible pre-assembly which mechanically connects these two components in a detachable manner, so that a force is not exerted on the cable when the lighting module is being handled. It is thus possible to carry the lighting module with its control device in one hand, while fitting it or transporting it to the assembly line of the lamp unit. The invention also makes it possible to separate the control device rapidly when it is being fitted in the lamp unit.

The invention therefore relates to a lighting module for a lighting and/or signaling device of a vehicle, comprising a first printed circuit board on which at least one light source is arranged, a support secured to the first printed circuit board, and a device for controlling the light source, which device is connected to the first printed circuit board by a flexible electrical link, characterized in that the control device comprises an integrated retaining means capable of holding the control device on the support in a detachable, or reversible, manner. Such a structure provides a predetermined position for temporarily installing the control device while waiting for the fitting of the lighting device in the lamp unit.

The term integrated means that the retaining means forms an integral part of the control device, that is to say it is in one piece, optionally without material discontinuity. This integrated means allows detachable holding without requiring the use of a tool.

The retaining means is therefore not an additional attached piece allowing temporary fastening, such as a screw, a threaded nut or a clip, which are retaining means excluded from the present invention.

According to a first characteristic, the retaining means is arranged in order to cooperate with a reception zone of the support, so as to hold the control device on the support in a detachable manner. Thus, the support has a shape adapted to receive the retaining means.

Advantageously, the retaining means comprises at least one projection extending from the control device, and the reception zone comprises at least one recess formed in the support. As an alternative, the retaining means comprises at least one recess formed in the control device, and the reception zone comprises at least one projection extending from the support. In these two cases mentioned above, holding of the control device relative to the support is achieved when the projection is accommodated in the recess.

According to another alternative embodiment, the at least one projection is positioned on the support and the at least one recess is positioned on the control device.

Advantageously, the flexible electrical link is secured permanently to the control device.

Even more advantageously, the flexible electrical link is also secured permanently to the first printed circuit board.

The two solutions presented above make it possible to increase the reliability of the electrical connections while avoiding the use of plug-in connectors, and thus to reduce the cost of the system.

According to one characteristic of the invention the support is a heat sink dissipating the heat generated at least by the light source, in other words a radiator. It is thus possible to cool the first printed circuit board, and more particularly the light source or sources. This makes it possible to use less expensive light-emitting diodes, while extending their lifetimes.

In such a case, the heat sink comprises a base on which the first printed circuit board rests, and a plurality of ribs, in other words fins, which extend from the base. The base thus forms a zone for fastening of the first printed circuit board, and the ribs increase the area for heat exchange with the fluid present in contact with the heat sink.

It will be noted that the lighting module according to the invention comprises at least one cut-off for cutting a light beam generated by the light source, the cut-off being secured to the support.

As an alternative or in addition, the lighting module comprises at least one device for reflecting the rays emitted by the light source, the reflection device being secured to the support.

As an alternative or in addition, the lighting module may also comprise a projection device, also secured to the support.

The lighting module, comprising a heat sink, a first printed circuit with the light sources, an optical device and a second printed circuit comprising the control part, can thus be assembled on an assembly line separate from the assembly line of the lamp unit. This makes it possible to use the lighting module in a plurality of lamp units or to reduce the size of the lamp unit assembly line so as to make it compatible with versions having fewer components to be assembled. A lighting module assembled in this way, with the control printed circuit temporarily secured to the lighting module, can be handled without risks for the electrical connections and is ready for use, that is to say ready to be fitted in the lamp unit.

The control device comprises a second printed circuit board secured to a piece capable of dissipating heat generated at the second printed circuit board. The piece in this case forms a heat sink which cools the electronic components installed on the second printed circuit board.

Advantageously, the piece has a first portion and a second portion, each of which extends in a separate and concurrent plane, in particular while making an angle of between 60° and 120°. Such organization makes it possible to comply with a small size both for the control device retained on the support and for the installation of this same control device in the internal volume of the lamp unit.

The invention also relates to a lighting and/or signaling device for a vehicle, comprising a lighting module incorporating any of the characteristics presented above.

Such a lighting and/or signaling device then comprises a chassis, and the support comprises a reception zone capable of cooperating with the retaining means, the reception zone being arranged in order to participate in securing of the support to the chassis.

Advantageously, the control device is secured to the chassis.

It will lastly be noted that the lighting and/or signaling device according to the invention is recognizable when the reception zone lies at a distance from the retaining means, when at least the control device is secured to the chassis.

One advantage according to the invention first of all resides in the guarantee that no mechanical force will be applied to the cable during transport or during movements between manufacturing stations. This ensures that the electrical connections, in particular the welds, formed between the cable and its two adjacent components do not experience a force liable to damage these electrical connections.

Another advantage resides in the possibility of manufacturing and checking a lighting subassembly ready to be installed, independently of the rest of the lamp unit.

Another not insignificant advantage resides in the fact that it is no longer necessary to use plug-in electrical connectors, which makes it possible to reduce the cost price of the lighting module according to the invention.

Another advantage of the invention resides in the fact that the reception means formed on the support can be used for another function, in particular a function of mechanically fastening the support in the lamp unit.

Another advantage of the invention resides in the weight reduction of the lamp unit. This is because a single heat sink cooling a plurality of heat sources will be heavier and larger than the sum of a plurality of heat sinks each dissipating a part of the total amount of heat to be dissipated.

These and other objects and advantages of the invention will be apparent from the following description, the accompanying drawings and the appended claims.

BRIEF DESCRIPTION OF THE ACCOMPANYING DRAWINGS

Other characteristics, details and advantages of the invention will become clearer on reading the description given below by way of indication with reference to the drawings, in which.

DETAILED DESCRIPTION OF THE PREFERRED EMBODIMENTS

It should be noted that the figures explain the invention in detail for implementation of the invention, and the figures may of course be used to define the invention more clearly where appropriate.

Figure 1:
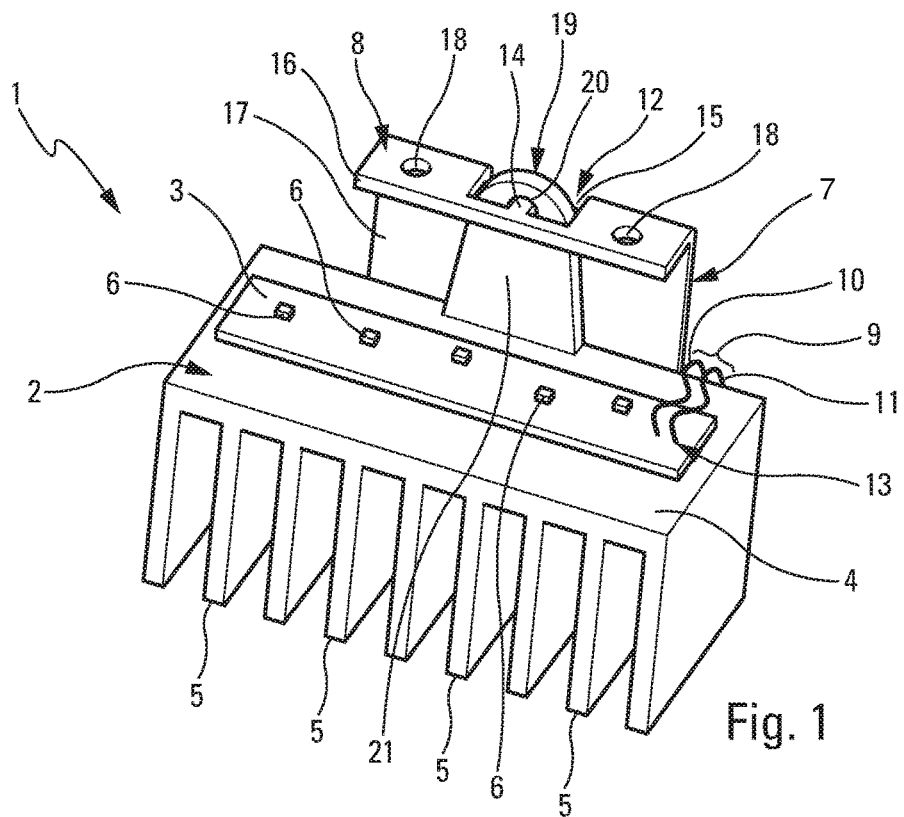
FIG. 1 is a schematic perspective view of a lighting module according to the invention.

FIG. 1 illustrates a lighting module 1 according to the invention. Such a lighting module 1 has a particularly beneficial application in a lighting and/or signaling device for a vehicle, in particular an automobile. This lighting and/or signaling device may, for example, be a tail light unit of this vehicle, although it may also be a headlamp unit of the vehicle, in particular with a view to fulfilling a lighting function of the low beam and/or high beam type.

According to the invention, such a lighting module 1 forms a subassembly separate from the lamp unit, before it is fitted therein. It comprises a multiplicity of pieces, including a support 2 to which a first printed circuit board 3 is secured.

According to one exemplary embodiment, such a support 2 is an internal plate fitted in the lamp unit, a reflector, a mask or a heat sink which are arranged in the internal volume of the lamp unit.

According to the variant represented in FIG. 1, the support 2 is a heat sink and it is formed by a substantially plane base 4 from which a plurality of ribs 5 extends, these delimiting flow channels for a coolant, in particular air. For example, such a heat sink or support 2 is solid because the base 4 and the ribs 5 are manufactured simultaneously from the same material, for example an aluminum alloy.

The support 2 receives the first printed circuit board 3, the latter being held mechanically on the base 4, for example by bonding using a thermally conductive adhesive, or alternatively by means of at least one screw (not represented) which fixes the first printed circuit board 3 on the support 2.

The first printed circuit board 3 is a substrate on which a multiplicity of electrically conductive tracks are routed. This first printed circuit board 3 receives at least one light source 6, advantageously formed by a light-emitting diode secured to the first printed circuit board 3. According to one example, the first printed circuit board 3 carries five light sources 6.

The lighting and extinguishing of the light sources are made dependent on a control device 7, the latter comprising a second printed circuit board (not shown in FIG. 1, but shown as part number 22 in FIG. 2) secured to a piece 8. The latter forms a plate dissipating heat generated by the second printed circuit board 22 (FIG. 2), and it also has a function of retaining the control device 7 on the support 2, as well as a function of securing the control device 7 to a point on the lamp unit.

The control device 7 electrically drives the light sources 6, and it is electrically connected to the first printed circuit board 3 by a flexible electrical link 9. The term flexible is intended to define a pliable electrical link which allows movement of the control device 7 relative to the support 2, without damaging the electrical link.

According to one exemplary embodiment, this flexible electrical link 9 comprises a plurality of cables 10 and 11, although it may also be a flat electrical ribbon of the Flex type. Such a flexible electrical link 9 comprises two ends, of which only a first end 13 secured to the first printed circuit board 3 is represented. According to the invention, the flexible electrical link 9 is secured by its first end 13 to the first printed circuit board 3 permanently. The latter expression indicates that the flexible electrical link 9 and the first printed circuit board 3 are not arranged to be made separable. In other words, pulling the flexible electrical link 9 away from the first printed circuit board 3 would lead to destruction of one or other of these components. By way of example, the permanent connection of the flexible electrical link 9 to one and/or other of the components which they connect is a weld, an adhesive bond, riveting, clamping or an inseparable terminal block. The same is true for the second end 23 (FIG. 2) of the flexible electrical link 9, which will be described in detail with reference to FIG. 2.

According to the invention, the control device 7 comprises an integrated retaining means 12, the function of which is to mechanically connect the control device 7 to the support 2 in order to make it possible to move the lighting module 1 without holding the control device 7 manually, while allowing rapid separation of this control device 7 from the support 2. It is in this way that the integrated retaining means 12 ensures holding which is detachable, i.e. reversible, without the use of a particular tool. At the end of the step of securing the flexible electrical link 9, on one side to the control device 7 and on the other to the first printed circuit board 3, the operator positions the control device 7 on the support 2 with the aid of the retaining means 12, thus ensuring that the control device 7 does not hang from the end of the flexible electrical link 9, which would risk damaging the electrical contact or contacts between the electrical links and the components which they connect.

Figure 2:
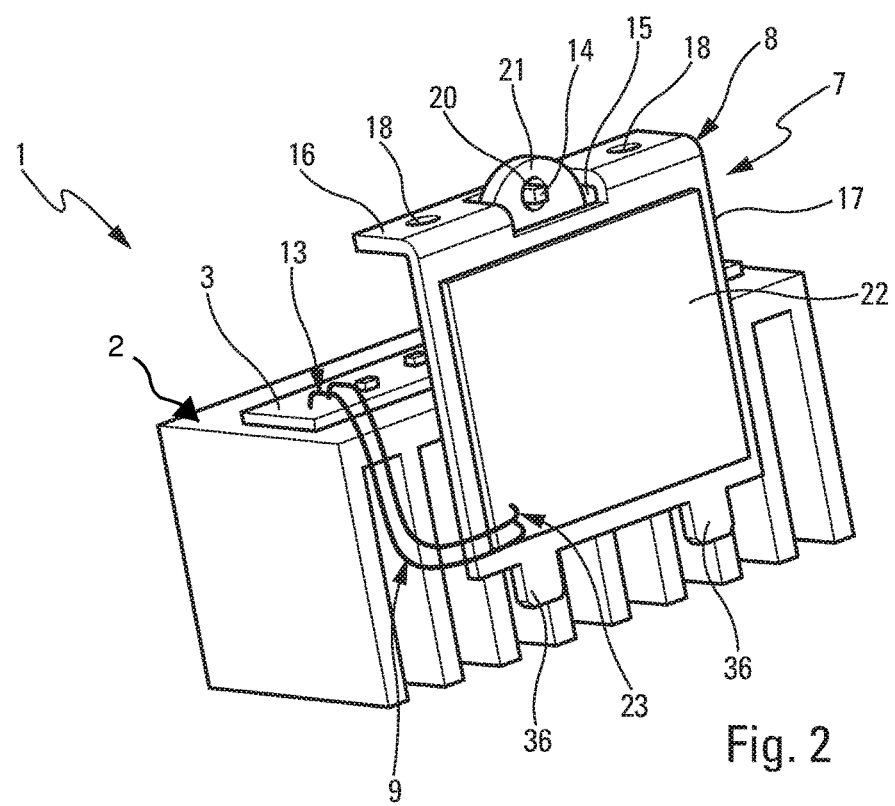
FIG. 2 is another schematic perspective view of the lighting module of FIG. 1.

According to the embodiment illustrated, the retaining means 12 is formed at least by a projection 14 extending from the control device 7, and more particularly extending from the piece 8 which supports the second printed circuit board 22 (FIG. 2). Preferably, the projection 14 has the shape of a tab, a finger, a pin or a rod. According to the example of FIG. 1, this projection 14 forms a finger which extends into a cavity 15 formed in the piece 8, preferably at the junction of a first constituent portion 16 and a second constituent portion 17 of the piece 8. The first constituent portion 16 and the second constituent portion 17 extend in separate and concurrent planes, and are in particular installed perpendicularly to one another. In other words, the piece 8 has an "L-shaped" cross section and the cavity 15, forming for example a hole extending through the piece 8, is formed at least level with the vertex formed between the first constituent portion 16 and the second constituent portion 17. It will also be noted that the first constituent portion 16 comprises at least one hole 18 which participates in the securing of the control device 7 to the lamp unit, during a phase of fitting the lighting module 1 in the lamp unit.

The retaining means 12 cooperates with the support 2 by means of a reception zone 19 formed on the support 2. Such a reception zone 19 is provided with at least one recess 20, the latter having for example the shape of a blind or through hole. Preferably, one recess 20 respectively corresponds to each projection 14.

Complementarily, the reception zone 19 comprises a tongue 21 which extends from the base 4 of the support 2, in a direction opposite to the direction in which the ribs 5 extend. In other words, the ribs 5 start on a first face of the base 4 while the tongue 21 starts on a second face of the base 4, on the opposite side of the base 4 from the first face.

The recess 20 is formed through the tongue 21, substantially at its free end. The latter penetrates into the cavity 15 of the control device 7, and the projection 14 penetrates into the recess 20. It is in this way that the detachable mechanical connection between the control device 7 and the support 2 is ensured during the phases of transporting the lighting module 1, while allowing rapid separation of these components, in particular by tilting the control device 7 about an axis perpendicular to a direction defining an extension of the recess 20. By carrying out this rotational movement, the end of the tongue 21 is freed from the cavity 15 and, by translation along the direction of the projection 14, the latter is extracted from the recess 20.

FIG. 2 shows a rear view of the lighting module 1 of FIG. 1. The piece 8, and more particularly the second constituent portion 17 of the piece 8, supports the second printed circuit board 22. The latter is thermally connected to the piece 8 by physical contact, optionally by means of a tab or a thermally conductive pad. The mechanical connection may also be produced by at least one screw (not represented) which secures the second printed circuit board 22 to the piece 8.

In the so-called transport position, it can be seen that the free end of the tongue 21 passes through the cavity 15 and extends from the first constituent portion 16. The finger, forming an exemplary embodiment of the projection 14, passes through the recess 20, which makes it possible to rest the control device 7 along the support 2.

As mentioned above, the flexible electrical link 9 is connected permanently to the first printed circuit board 3 at its first end 13. Advantageously, the second end 23 of the flexible electrical link 9 is secured permanently to the control device 7, in particular to the second printed circuit board 22. The permanent nature of this electrical connection means that the flexible electrical link 9 and the second printed circuit board 22 are not arranged to be made separable. In other words, separation, for example by pulling, of the flexible electrical link 9 from the second printed circuit board 22 would lead to destruction of one or other of these components. By way of example, the permanent connection of the flexible electrical link 9 at the second end 23 on one and/or other of the components which they connect is a weld, an adhesive bond, riveting, clamping or an inseparable terminal block.

FIG. 2 also shows the existence of means for fixing the control device 7 on the lamp unit, once the decision is made to fit the lighting module 1 in the lamp unit. These means comprise, for example, holes 18 formed in the first constituent portion 16 of the piece 8. As an alternative or complementarily, the means or holes 18 comprise at least one tab 36 formed at the second constituent portion 17 of the piece 8. In this exemplary embodiment, the second constituent portion 17 comprises two tabs 36 which are materially integral with the second constituent portion 17 and which extend beyond it while continuing in a plane coinciding with the constituent plane in which the second constituent portion 17 extends. Of course, the scope of the invention is not limited to this arrangement, and the tabs 36 may be oriented differently and, in general, the means for fastening the control device 7 on the lamp unit may be different so long as it participates in the securing of the control device 7 to the lamp unit, in particular to an internal chassis of the lamp unit.

Figure 3:
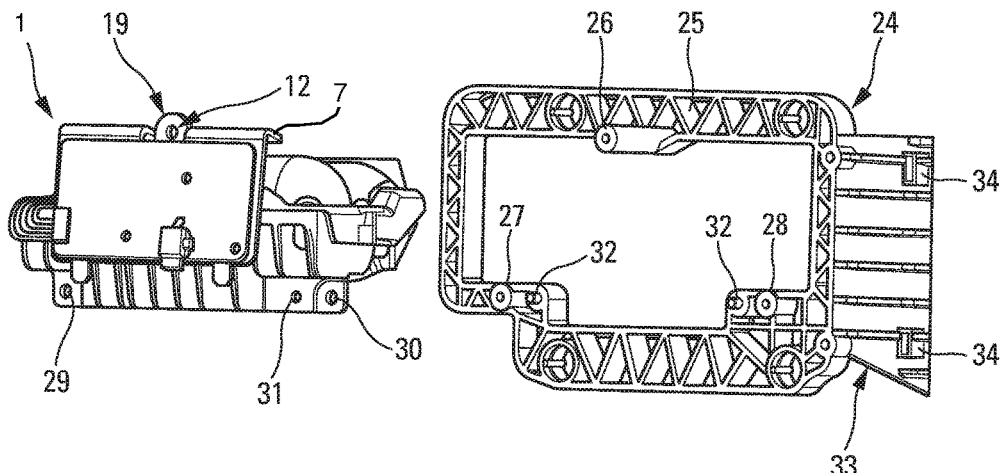
FIG. 3 is a perspective view of the lighting module in the approach phase with a view to fastening it in a lamp unit.

FIG. 3 partially illustrates a lighting and/or signaling device before reception of the lighting module 1 according to the invention. The latter is in the approach phase, and the control device 7 is held temporarily on the support 2.

This FIG. 3 shows a chassis 24, which forms an element for receiving the lighting module 1. This chassis 24 is secured to the lamp unit, and has a rectangular overall shape recessed at its center, so as to provide accommodation of the support 2 accompanied by its components therein. This chassis 24 is made of plastic. Its mechanical structure is reinforced by the presence of a multiplicity of reinforcements 25. It comprises at least one fastening point 26 intended to cooperate with the reception zone 19 of the retaining means 12. It will be understood here that the same technical element of the lighting module 1 is employed for at least two functions, that is to say holding the control device 7 during the phases prior to fitting of the lighting module 1 in the lamp unit, and participating in the securing of the support 2 to the chassis 24 of the lamp unit.

In the exemplary embodiment represented here, the chassis 24 comprises two additional fastening points referenced 27 and 28, which receive for example a screw that passes through the support 2 at holes 29 and 30. It will be noted that the support 2 furthermore comprises two centering recesses 31, each of which receives a centering pin 32 extending from the chassis 24.

One of the side edges which delimits the chassis 24 comprises an extension 33 on which at least one point 34 for securing the control device 7 is formed.

Figure 4:
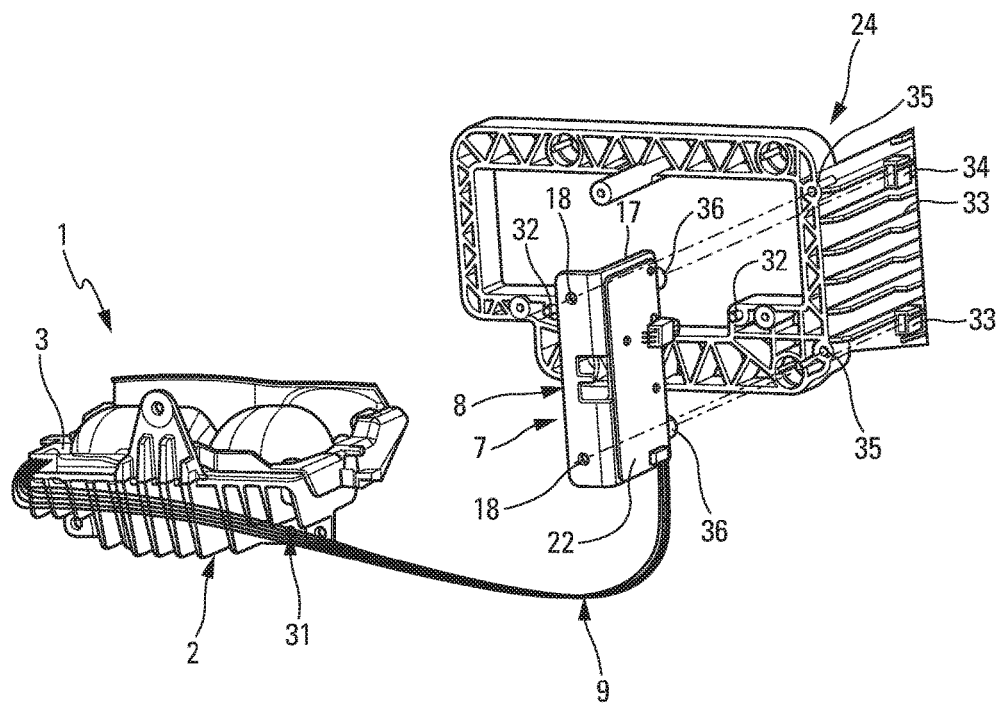
FIG. 4 is a perspective view of the lighting module according to a step of fitting on the lamp unit.

FIG. 4 shows the lighting module 1 in the phase of approaching the chassis 24. The difference from FIG. 3 resides in the fact that the control device 7 has been separated from the support 2. The flexible electrical link 9 connects the first printed circuit board 3 to the second printed circuit board 22.

The dashed lines illustrate the positioning of fastening means (not represented) which are used to connect the control device 7 to the chassis 24. These fastening means are, for example, screws or rivets.

The holes 18 formed in the piece 8 are thus each aligned with a fastening point 35. The control device 7 is provided with two tabs 36 intended to be accommodated in the securing points 34 formed on the extension 33.

Figure 5:
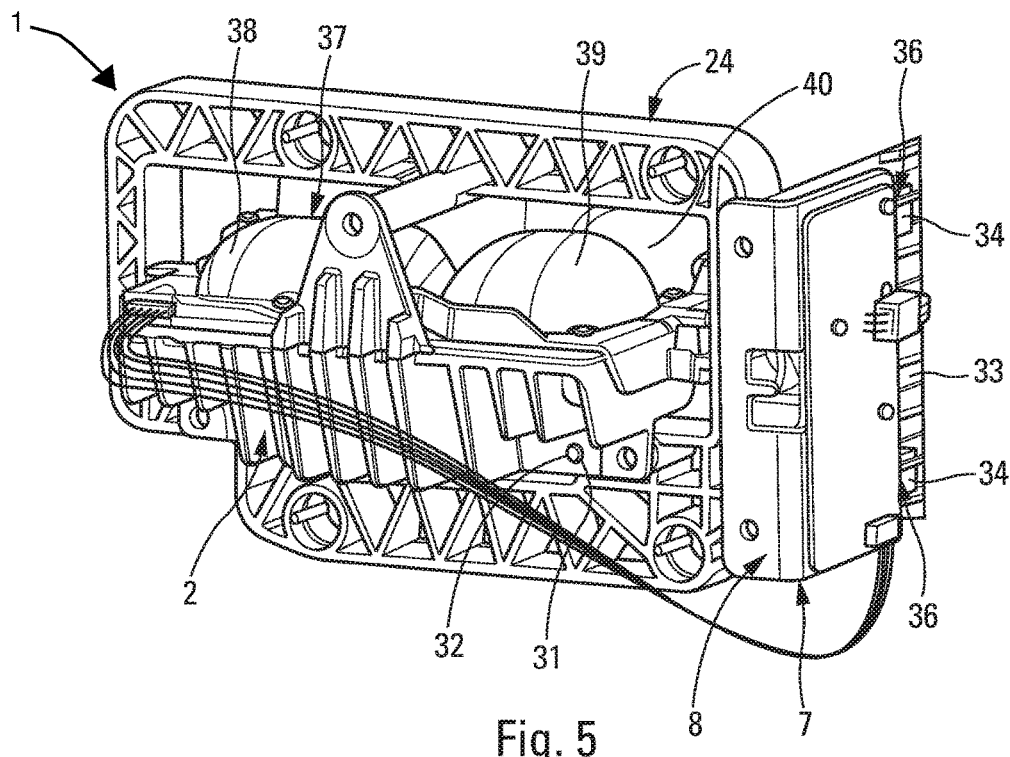
FIG. 5 is a perspective view of the lighting module secured to the lamp unit.

FIG. 5 shows the lighting module 1 after assembly on the chassis 24. The control device 7 and the support 2 are thus translated toward the chassis 24 until, on the one hand, the support 2 is accommodated in the central recess of the chassis 24, centering it by the cooperation of the centering pins 32 with the centering recesses 31, and on the other hand the tabs 36 are accommodated in the securing points 34 so as to fix the control device 7 along the extension 33.

The "L" shape of the constituent piece 8 of the control device 7 is advantageous because it makes it possible not only to install the control device 7 on the support 2 during the phases prior to fitting on the chassis 24, so as to limit the total size of the lighting module 1, but also this "L" shape makes it possible to accommodate and fix the control device 7 easily on the chassis 24, also limiting the size necessary for this fastening in the lamp unit.

FIG. 5 makes it possible to see that the lighting module 1 also comprises at least one cut-off for cutting a light beam generated by the light source or sources installed on the support 2. This cut-off is not visible in FIGS. 3 to 6 because it is covered by a reflection device 37. Such a cut-off is secured to the support 2, in particular by screws, and these screws may also participate in the fastening of the reflection device 37. Such a cut-off masks an upper part of the light beam so as to generate a non-dazzling beam, for example of the low beam type. The cut-off is, for example, a folder.

The lighting module 1 according to the invention therefore comprises the optical device, the function of which is to project a beam with a particular shape onto the road. This optical device may comprise a reflection device 37, the function of which is to collect and/or reflect the rays emitted by one or more light sources of the lighting module 1. Such a reflection device 37 in this case comprises two reflectors 38 and 39; the two reflectors 38 and 39 may form a unitary piece or may form two separate pieces.

The lighting module 1 according to the invention also comprises at least one projection device 40 secured to the support 2, for example by means of screws. This projection device 40 concentrates and/or focuses the rays reflected by the reflection device 37, with a view to forming the light beam to be projected on the road on which the vehicle is driving. By way of example, such a projection device 40 is a dioptric element formed, in particular, by a lens.

Figure 6:
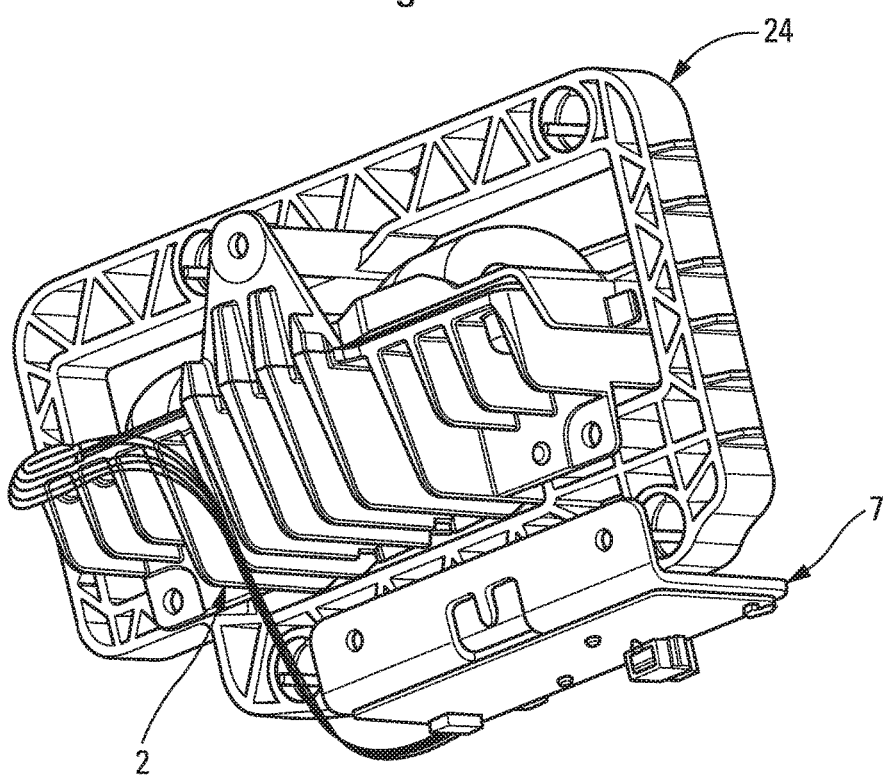
FIG. 6 is a perspective view of the lighting module secured to the lamp unit, according to a first positioning variant.

FIG. 6 shows a variant of the lighting and/or signaling device, which differs from that represented in FIG. 5 by the position of the control device 7 on the chassis 24. While in the variant of FIGS. 3 to 5 the control device 7 is secured to the chassis 24 on the side of the support 2, along a horizontal axis, FIG. 6 shows the control device 7 secured to the chassis 24 of the lamp unit under the support 2, i.e. on the side of this support 2 along a vertical axis.

Figure 7:
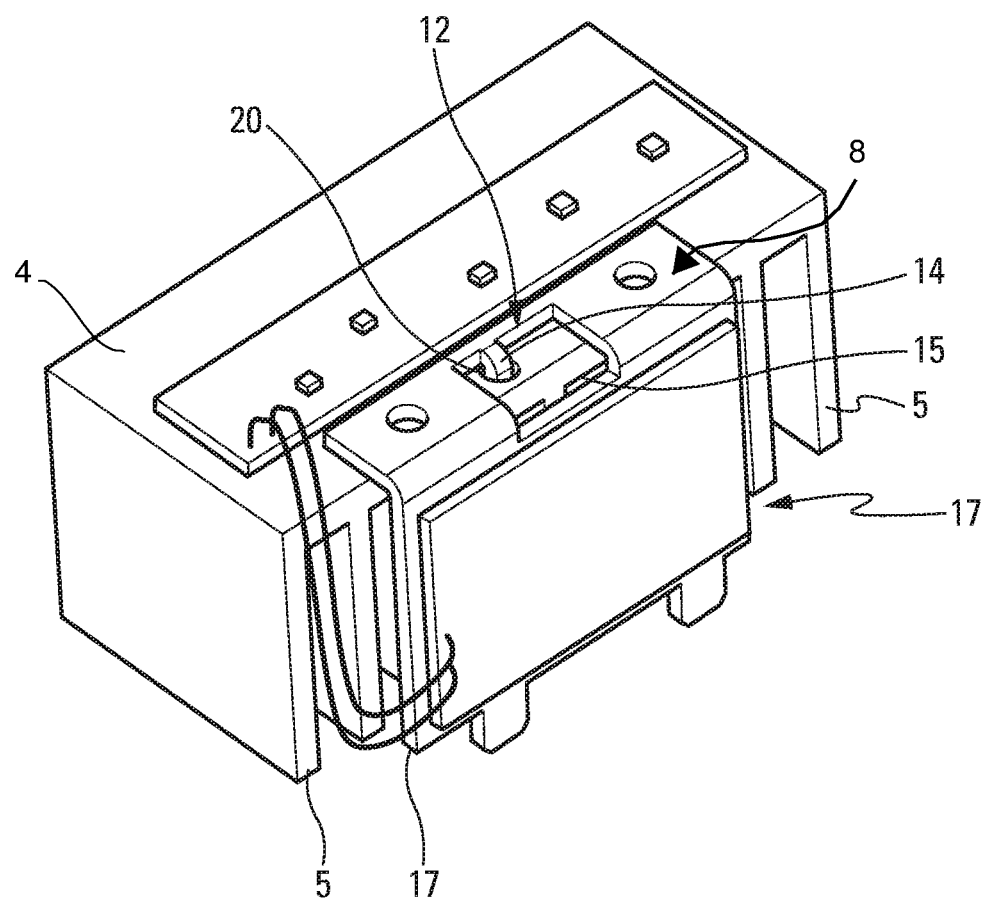
FIG. 7 is a schematic perspective view of a lighting module according to a second positioning variant.

FIG. 7 shows an alternative embodiment of the lighting module 1. Compared with the variant of FIGS. 1 and 2, it can be seen that the projection 14 of the retaining means 12 does not extend into the cavity 15. This projection 14 in this case forms a finger which extends in a plane parallel, or substantially parallel, to the plane in which the second constituent portion 17 of the piece 8 extends.

The reception zone 19 of the support 2 is in this case formed by a recess 20 produced directly in the base 4 of the support 2. The holding of the control device 7 on the support 2 is then obtained when the projection 14 is inserted into the recess 20, the "L" shape of the control device 7 making it possible to press the second constituent portion 17 against edges of the ribs 5. As regards the other characteristics, reference may be made to FIGS. 1 and 2, as well as the description relating thereto.

The figures described above show an integrated retaining means, produced in the form of a projection extending from the control board, combined with a reception zone of the support provided with a recess. Of course, according to another embodiment, not represented, the invention includes a reverse situation in which the integrated retaining means comprises at least one recess formed in the control device and the reception zone has at least one projection extending from the support.

It will be noted that the invention is recognizable so long as a lamp unit, or lighting and/or signaling device, comprises a radiator carrying light sources and fixed to the lamp unit, electrically connected by a permanent cable to a device for driving the light sources, in which this driving device can be retained on the radiator in a standby position by suitable means facilitating detachability of the control device from the radiator.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A lighting module adapted to be mounted on a vehicle, comprising:
    a first printed circuit board on which at least one light source is arranged;
    a first support secured to said first printed circuit board, and including a heat sink; and
    a control device for controlling said at least one light source, said control device comprises a second printed circuit board mounted on a second support, said second printed circuit board being connected to said first printed circuit board by a flexible electrical link, wherein said control device further comprises a retainer for detachably holding said control device on said first support in a detachable manner such that said lighting module can be moved without holding said control device manually while allowing said detachment or separation of said control device from said first support when said first support and said second support are situated in or removed from said lighting module;
    wherein said first printed circuit board being mounted on said first support;
    wherein said integrated retaining means comprises at least one projection extending from said first support and said second support comprises at least one recess, said at least one recess being adapted to receive at least a portion of said at least one projection in order to detachably hold said control device on said first support, wherein said control device has one of said at least one projection and said at least one recess when said first support has the other of said at least one projection and at least one recess.

2. The lighting module as claimed in claim 1, wherein said flexible electrical link is secured permanently to said control device.

3. A lighting module adapted to be mounted on a vehicle, comprising:
    a first printed circuit board on which at least one light source is arranged;
    a first support secured to said first printed circuit board, and including a heat sink; and
    a control device for controlling said at least one light source, said control device comprises a second printed circuit board mounted on a second support, said second printed circuit board being connected to said first printed circuit board by a flexible electrical link and an integrated retaining means for detachably holding said control device on said first support in a detachable manner such that said lighting module can be moved without holding said control device manually while allowing said detachment or separation of said control device from said first support when said first support and said second support are situated in or removed from said lighting module;
    wherein said first printed circuit board being mounted on said first support;
    wherein said integrated retaining means comprises at least one projection and at least one recess adapted to receive at least a portion of said at least one projection in order to detachably hold said control device on said first support, wherein said control device has one of said at least one projection and said at least one recess when said first support has the other of said at least one projection and at least one recess.

4. The lighting module as claimed in claim 3, wherein said flexible electrical link is secured permanently to said control device.

5. The lighting module as claimed in claim 3, wherein said flexible electrical link is secured permanently to said first printed circuit board.

6. The lighting module as claimed in claim 3, wherein said at least one light source is at least one light-emitting diode.

7. The lighting module as claimed in claim 3, wherein said heat sink dissipates heat generated by said at least one light source.

8. The lighting module as claimed in claim 7, wherein said heat sink comprises a base on which said first printed circuit board rests and a plurality of ribs which extend from said base.

9. The lighting module as claimed in claim 3, wherein said control device comprises said second printed circuit board secured to a piece capable of dissipating heat generated at said second printed circuit board.

10. The lighting module as claimed in claim 9, wherein said piece is generally L-shaped and has a first portion and a second portion, each of which extends in separate planes.

11. The lighting module as claimed in claim 3, said first support further comprising a reception portion, wherein said integrated retaining means is arranged in order to cooperate with said reception portion to detachably hold said control device on said first support.

12. The lighting module as claimed claim 11, wherein said integrated retaining means comprises said at least one projection that extends from said control device, and said reception zone comprises said at least one recess formed in said first support.

13. The lighting module as claimed in claim 11, wherein said integrated retaining means comprises said at least one projection that extends from said first support, and said reception zone comprises said at least one recess formed in said control device.

14. A lighting and/or signaling device for a vehicle, comprising a lighting module as claimed in claim 3.

15. The lighting and/or signaling device as claimed in claim 14, comprising a chassis, wherein said first support comprises a reception zone capable of cooperating with said integrated retaining means, said reception zone being arranged in order to participate in securing of said first support to said chassis.

16. The lighting and/or signaling device as claimed in claim 15, wherein said control device is secured to said chassis.

17. The lighting and/or signaling device as claimed in claim 15, wherein said reception zone lies at a distance from said integrated retaining means when at least said control device is secured to said chassis.

* * * * *